(12) United States Patent
Thompson et al.

(10) Patent No.: US 8,796,048 B1
(45) Date of Patent: Aug. 5, 2014

(54) MONITORING AND MEASUREMENT OF THIN FILM LAYERS

(75) Inventors: Scott E. Thompson, Gainesville, FL (US); Pushkar Ranade, Los Gatos, CA (US); Lance Scudder, Sunnyvale, CA (US); Charles Stager, Austin, TX (US)

(73) Assignee: Suvolta, Inc., Los Gatos, CA (US)

( * ) Notice: Subject to any disclaimer, the term of this patent is extended or adjusted under 35 U.S.C. 154(b) by 215 days.

(21) Appl. No.: 13/469,598

(22) Filed: May 11, 2012

Related U.S. Application Data

(60) Provisional application No. 61/484,785, filed on May 11, 2011.

(51) Int. Cl.
  *H01L 21/66* (2006.01)
  *H01L 21/67* (2006.01)
  *H01L 21/762* (2006.01)

(52) U.S. Cl.
  CPC ............... *H01L 21/67253* (2013.01); *H01L 21/76229* (2013.01)
  USPC ........................................... 438/14; 438/638

(58) Field of Classification Search
  CPC .................... H01L 21/67253; H01L 21/76229
  USPC .................................................... 438/14, 638
  See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,141,780 A * | 2/1979 | Kleinknecht et al. ............ 117/85 |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |

(Continued)

FOREIGN PATENT DOCUMENTS

| | | |
|---|---|---|
| EP | 0274278 | 7/1988 |
| EP | 0312237 | 4/1989 |

(Continued)

OTHER PUBLICATIONS

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, (Dec. 13-15, 2004).

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

(Continued)

*Primary Examiner* — Earl Taylor
(74) *Attorney, Agent, or Firm* — Novak Druce Connolly Bove + Quigg LLP

(57) ABSTRACT

The present disclosure provides methods and structures for measurement, control, and monitoring the thickness of thin film layers formed as part of a semiconductor manufacturing process. The methods and structures presented provide the capability to measure and monitor the thickness of the thin film using trench line structures. In certain embodiments, the thin film thickness measurement system can be integrated with thin film growth and control software, providing automated process control (APC) or statistical process control (SPC) capability by measuring and monitoring the thin film thickness during manufacturing. Methods for measuring the thickness of thin films can be important to the fabrication of integrated circuits because the thickness and uniformity of the thin film can determine electrical characteristics of the transistors being fabricated.

19 Claims, 7 Drawing Sheets

(56) References Cited

U.S. PATENT DOCUMENTS

| | | |
|---|---|---|
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,110 A * | 3/1994 | Schoenborn et al. ............. 438/5 |
| 5,298,763 A | 3/1994 | Shen et al. |
| 5,369,288 A | 11/1994 | Usuki |
| 5,372,673 A * | 12/1994 | Stager et al. ...................... 438/8 |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farrenkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,057,068 A * | 5/2000 | Raeder et al. ................... 430/30 |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,210,980 B1 * | 4/2001 | Matsuda ............................ 438/4 |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,646,751 B2 * | 11/2003 | Kishimura .................... 356/626 |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B2 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |

(56) References Cited

U.S. PATENT DOCUMENTS

| | | |
|---|---|---|
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jaehne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,634 B2 * | 3/2009 | Sato et al. ............... 438/422 |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,767,471 B2 * | 8/2010 | Wang et al. ............... 438/5 |
| 7,795,677 B2 | 9/2010 | Bangsaruntip et al. |

(56) References Cited

U.S. PATENT DOCUMENTS

| | | |
|---|---|---|
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2002/0097405 A1* | 7/2002 | Kishimura .................. 356/625 |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0155570 A1* | 8/2003 | Leidy ............................ 257/48 |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0035433 A1* | 2/2005 | Park et al. .................... 257/620 |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0091551 A1* | 5/2006 | Lin et al. ..................... 257/762 |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2006/0284173 A1* | 12/2006 | Quevedo-Lopez et al. ...... 257/48 |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0035883 A1* | 2/2009 | Wang et al. ..................... 438/17 |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |

(56) References Cited

U.S. PATENT DOCUMENTS

| | | |
|---|---|---|
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Abiko, H et al., "A Channel Engineering Combined with Channel Epitaxy Optimization and TED Suppression for 0.15µm n-n Gate CMOS Technology", 1995 Symposium on VLSI Technology Digest of Technical Papers, pp. 23-24, 1995.
Chau, R et al., "A 50nm Depleted-Substrate CMOS Transistor (DST)", Electron Device Meeting 2001, IEDM Technical Digest, IEEE International, pp. 29.1.1-29.1.4, 2001.
Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.
Ernst, T et al., "Nano scaled MOSFET Transistors on Strained Si, SiGe, Ge Layers: Some Integration and Electrical Properties Features", ECS Trans. 2006, vol. 3, Issue 7, pp. 947-961, 2006.
Goesele, U et al., Diffusion Engineering by Carbon in Silicon, Mat. Res. Soc. Symp. vol. 610, 2000.
Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.
Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.
Holland, OW and Thomas, DK "A Method to Improve Activation of Implanted Dopants in SiC", Oak Ridge National Laboratory, Oak Ridge, TN, 2001.
Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.
Lavéant, P. "Incorporation, Diffusion and Agglomeration of Carbon in Silicon", Solid State Phenomena, vols. 82-84, pp. 189-194, 2002.
Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.
Ohguro, T et al., "An 0.18-µm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.
Pinacho, R et al., "Carbon in Silicon: Modeling of Diffusion and Clustering Mechanisms", Journal of Applied Physics, vol. 92, No. 3, pp. 1582-1588, Aug. 2002.
Robertson, LS et al., "The Effect of Impurities on Diffusion and Activation of Ion Implanted Boron in Silicon", Mat. Res. Soc. Symp. vol. 610, 2000.
Scholz, R et al., "Carbon-Induced Undersaturation of Silicon Self-Interstitials", Appl. Phys. Lett. 72(2), pp. 200-202, Jan. 1998.
Scholz, RF et al., "The Contribution of Vacancies to Carbon Out-Diffusion in Silicon", Appl. Phys. Lett., vol. 74, No. 3, pp. 392-394, Jan. 1999.
Stolk, PA et al., "Physical Mechanisms of Transient Enhanced Dopant Diffusion in Ion-Implanted Silicon", J. Appl. Phys. 81(9), pp. 6031-6050, May 1997.
Thompson, S et al., "MOS Scaling: Transistor Challenges for the 21st Century", Intel Technology Journal Q3' 1998, pp. 1-19, 1998.
Wann, C. et al., "Channel Profile Optimization and Device Design for Low-Power High-Performance Dynamic-Threshold MOSFET", IEDM 96, pp. 113-116, 1996.
Werner, P et al., "Carbon Diffusion in Silicon", Applied Physics Letters, vol. 73, No. 17, pp. 2465-2467, Oct. 1998.
Yan, Ran-Hong et al., "Scaling the Si MOSFET: From Bulk to SOI to Bulk", IEEE Transactions on Electron Devices, vol. 39, No. 7, Jul. 1992.
Banerjee, et al. "Compensating Non-Optical Effects using Electrically-Driven Optical Proximity Correction", Proc. of SPIE vol. 7275 72750E, 2009.
Cheng, et al. "Extremely Thin SOI (ETSOI) CMOS with Record Low Variability for Low Power System-on-Chip Applications", Electron Devices Meeting (IEDM), Dec. 2009.
Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.
Drennan, et al. "Implications of Proximity Effects for Analog Design", Custom Integrated Circuits Conference, pp. 169-176, Sep. 2006.
Hook, et al. "Lateral Ion Implant Straggle and Mask Proximity Effect", IEEE Transactions on Electron Devices, vol. 50, No. 9, pp. 1946-1951, Sep. 2003.
Hori, et al., "A 0.1 µm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.
Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.
Shao, et al., "Boron Diffusion in Silicon: The Anomalies and Control by Point Defect Engineering", Materials Science and Engineering R: Reports, vol. 42, No. 3-4, pp. 65-114, Nov, 1, 2003, Nov. 2012.
Sheu, et al. "Modeling the Well-Edge Proximity Effect in Highly Scaled MOSFETs", IEEE Transactions on Electron Devices, vol. 53, No. 11, pp. 2792-2798, Nov. 2006.

* cited by examiner

MONITORING AND MEASUREMENT OF THIN FILM LAYERS

CROSS-REFERENCE TO RELATED APPLICATIONS

This application claims priority to U.S. Provisional Patent Application No. 61/484,785, filed May 11, 2011 and entitled "Monitoring of Epitaxial Layers", the contents of which are hereby incorporated by reference in their entirety.

FIELD OF THE INVENTION

Integrated circuit manufacturing processes and metrology are disclosed.

BACKGROUND

Semiconductor manufacturing involves various steps involving forming a layer of material, patterning the material, forming another layer of material and so on. Metrology is a key component of process control for any manufacturing process. In the case of semiconductor manufacturing, metrology is used in a variety of capacities including the measurement of a thickness of a deposited material layer.

One method of measuring a film is to cut (e.g., scribe and break) the substrate through a feature of interest, thus exposing a cross-section of the feature. The feature may then be examined using microscopy, for example, scanning electron microscopy (SEM) or transmission electron microscopy (TEM). Unfortunately, the substrate is destroyed by cutting. Moreover, the number of features that can be examined are limited to those features lying along the cut.

Another method includes using a measuring instrument set up to shine a beam of light through the material to be measured, and using the index of refraction of material, calculating a film thickness. A problem with this method is that the measurement needs to be done for a material that stops on a different material having a different index of refraction, for instance, silicon on silicon dioxide or vice-versa.

Another method that lends itself to in-line metrology includes creating a proxy in the form of features that are intended to be representative of one or more dies. The proxies may be placed between selected dies on the substrate. The features in the proxy may be measured during various steps in the manufacturing process using a probe such as a light beam having small spot size about the size of the proxy structure. However, it can be difficult to align the substrate and position the proxies within such a small spot size. Also, depending on the layer grown and proxies used for metrology, features in the proxies may or may not be representative of features in the dies.

DETAILED DESCRIPTION

Figure 1:
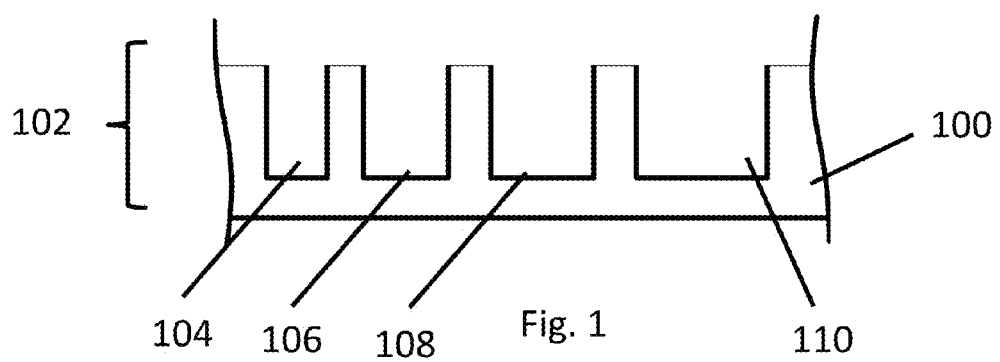
FIG. 1 illustrates a cross sectional view of a trench line structure on a substrate.

The present disclosure is provided with reference to the attached figures, wherein like reference numerals are used throughout the figures to designate similar or equivalent elements. The figures are not drawn to scale and they are provided merely to illustrate embodiments. It should be understood that numerous specific details, relationships, and methods are set forth to provide a full understanding of the embodiments. One having ordinary skill in the relevant art, however, will readily recognize that the embodiments can be practiced without one or more of the specific details or with other methods. In other instances, well-known structures or operations are not shown in detail to avoid obscuring the embodiments. The present embodiments are not limited by the illustrated ordering of acts or events, as some acts may occur in different orders and/or concurrently with other acts or events. Furthermore, not all illustrated acts or events are required to implement a methodology described herein.

As noted above, in-line monitoring in a semiconductor manufacturing process is performed via the use of proxies on a same wafer as the dies being formed. However, despite the fact than many semiconductor manufacturing processes can be adequately monitored using such proxies, adequate proxies are unavailable for certain types of processes. One exemplary process is the growth of thin blanket epitaxial silicon films on silicon substrates. Many types of modern semiconductor devices generally rely on the deposition of semiconductor films on semiconductor surfaces to form features for such devices. For example, some types of diodes, bipolar transistor devices, and field effect transistor devices.

However, obtaining a measurement of the thickness of such deposited films is generally non-trivial, specifically in the case of like material films deposited on like material substrates or substrate features, such as silicon, silicon germanium, other silicon alloys, metals, dielectrics, etc. Moreover, because the methods available for measurement of layer thickness for such epitaxial films are typically destructive, time consuming, inaccurate, or any combination thereof, these existing techniques are generally not suitable use in in-line monitoring of epitaxial growth thickness. For example, SEM imaging can be accurate, but is also destructive, as described above. Also, SEM may not be able to resolve like materials deposited on like substrate features except in the case of interfacial contamination (creating a reference signal for the original surface location to compare against the final growth surface). Additionally, the cleaving of a wafer is a source of particulates, rendering this measurement technique incompatible with cleanroom standards requiring low particulate levels. Accordingly, SEM measurements are typically performed after the processing of a wafer is completed. Thus, incorrect setting on a tool depositing epitaxial films may not be detected until much later in processing, potentially resulting in a large number of wafers that may need to be discarded.

Non-destructive direct measurement techniques are also available, but are generally impractical or useless for in-line monitoring of thin like material deposited on like substrate features. For example, X-ray diffraction (XRD) and spectroscopic elipsometry scans can be utilized to obtain an estimate of epitaxial layer thicknesses with a high degree of accuracy. However, to resolve the thickness of the added material, requires the deposited film to have different crystallographic spacing or emmisivity than the underlying substrate feature. Thus, in the case of thin blanket layer deposition over a like material substrate, these techniques are not effective to resolve the thickness of the deposited material.

Indirect techniques are also available to estimate thickness. These are generally less time consuming and suitable for use within a cleanroom for in-line process monitoring, but their accuracy is limited. One common type of monitoring of silicon epitaxial film growth is to provide a layer of silicon oxide comprising material (if the epitaxial process is non-selective) or polysilicon on oxide (if the epitaxial process is selective). The polysilicon thickness can then be measured before and after the epitaxial film process is performed using ellipsometry or profilometry measurements. The difference in thickness can then be correlated to an epitaxial film thickness. However, this method has several issues.

First, in the case of ellipsometry, the growth characteristics of the polysilicon film being measured may not directly correlate to the growth characteristics of the silicon-comprising epitaxial film being grown. Accordingly, variations in process conditions can result in significant variations in polysilicon growth without triggering corresponding variations in the epitaxial film. Worse yet, variations in process conditions can also result in significant variations in epitaxial film growth without corresponding variations in the polysilicon film. Accordingly, use of such a technique would require significant efforts in not only a characterization of the formation of the epitaxial film, but also a characterization of the formation of the polysilicon films to provide a complete and useful set of data.

Second, in the case of profilometry, the results may be limited in accuracy, be time consuming, or both. Profilometry measurements generally rely on the measurement of a step height between the region in which the polysilicon is formed and an adjacent region of a second material type such as single crystal silicon. In the case of a conventional stylus-type profilometer device, the resolution may be limited. In some cases, a resolution of approximately 1 nm may be possible. However, in the case of silicon growth, both the polysilicon and single crystal silicon, both surfaces will growing simultaneously, so the difference between the film stacks may be substantially smaller than the film thickness being deposited which would lead to difficulty resolving a step height change. Higher resolution profilometry methods, such as Atomic force microscopy (AFM) or scanning force microscopy (SFM), are available and can be utilized to obtain a step height with a nanometer resolution. However, even when high resolution profilometry measurements are is available, such profilometry measurement rely on a 2-dimensional scans of a feature that changes based on the relative growth rates between two adjacent materials. Another limitation with this kind of measurement is that the starting substrate may not have dielectric or poly features adjacent to the deposited film of interest. For instance, the wafer surface may be 100% single crystal silicon with no feature that would offer a relative growth rate measurement opportunity of an adjacent polysilicon film.

In view of the limitations of conventional epitaxial film growth measurement techniques, the various embodiments provide a new methodology for an in-line measurement of epitaxial film growth. This methodology is non-destructive, can be performed at the time of growth of the epitaxial films, and provides an on-wafer measurement suitable for in-line process monitoring consisting of a simple visual inspection.

The embodiments presented are based upon the premise that, when a wafer including a trench of depth Z and having a width X<Z is exposed to a conformal thin film process (i.e., a process that deposits a thin film of approximately equal thickness on the top, bottom and sidewall surfaces of the trench), the material deposited on the sidewalls will eventually meet and fill or otherwise close the trench. At the point when closure begins to occur, the thickness of the thin film is around X/2. If the trench is completely filled or closed, the thickness of the thin film is likely >X/2. In contrast, if a trench remains defined, in other words, not closed, the thickness of the thin film is <X/2. This principle applies to a variety of trench widths. Thus, when a wafer including a trench of depth Z and having a width Y<Z is exposed to same conformal thin film process, the thickness of the thin film is likely around Y/2 when the trench is substantially filled or closed. If the trench is completely filled or closed, the thickness of the thin film is likely >Y/2. In contrast, if a trench remains defined, in other words, not closed, the thickness of the thin film is less than Y/2.

As used herein with respect to a trench, the terms "substantially filled" and "substantially closed", refer to trench narrowed by material deposited therein to a point in which there results one portion of the previously open trench now being completely filled or substantially filled compared to other portions of the trench. Alternatively stated, a substantially filled or closed trench is one in which at least one portion of the material formed on a first sidewall begins to come into contact with the material formed on the second, opposing sidewall. In other words, a trench that is discontinuous or blocked to some extent. For example, a substantially filled or closed trench can be one in which 2%, 5% or 10% or other percentage of the resulting trench is completely filled. For calibration purposes, which shall be described below, one preferably determines in advance the visual characteristics of a "substantially filled" trench and maintains such characteristics as a constant.

When at least two trenches of differing widths are formed on a same wafer (where X>Y and constant depth Z) and the wafer is exposed to a conformal thin film process, the comparative degree of filling or closing of the two trenches allows for an accurate estimate of thin film thickness to be obtained. For example, if neither trench is substantially filled or closed, then the thickness of deposited film is less than approximately Y/2. If both trenches are filled or closed, then the thickness of the deposited film is greater than approximately X/2. If only the trench of width Y is substantially filled or closed, then the thickness of the deposited film is approximately Y/2. As a result, the inclusion of two trenches provides a means for estimating the deposited film as being in one of three film thickness ranges based on solely a visual inspection of the trenches.

Various embodiments provide for forming at least one multi-trench array on a wafer prior to epitaxial film growth. In particular, the trench array is formed on a wafer surface to provide a plurality of trenches with different trench widths, where the trench widths can be selected to allow estimating of the thin film thickness for different ranges of thickness based on the principle described above. When such a trench array is exposed to a thin film process that forms material on the top, bottom, and sidewalls of the trench, the substantially filled trenches can be utilized to estimate the thickness of the deposited film. Note that a film may be considered as "deposited" or grown depending on the type of fabrication process.

Such a methodology provides several advantages over conventional thin film measurement techniques. First, since thin film thickness can be determined via a simple visual inspection, such a process can be performed with a relatively high throughput so as to be suitable for in-line monitoring of the thin film process. Second, as the inspection can be performed immediately and quickly after the thin film process, the decision to scrap wafers as unusable can be made prior to the wafer proceeding to additional processing. Third, since the measurement of film thickness is based on lateral growth or deposition, a trench width effectively corresponds to a measurement of a film thickness of approximately one half the trench width. An exemplary structure of a test structure in accordance with the various embodiments is illustrated below with respect to FIG. 1

Although the various embodiments will be described primarily with respect to a silicon film deposited on silicon substrate process, the embodiments are not limited in this regard. Rather, the various embodiments are equally useful for measurement of thin films of any type.

FIG. 1 illustrates a cross sectional view of a portion of substrate 100 having formed thereon an embodiment of a trench line structure 102, with an array of multiple trenches 104, 106, 108, and 110.

The trench structure 102 can be formed in a variety of ways. For example, the trench structure can be formed using a combination of masking and etching steps. Masking steps can include, for example, the formation of a pattern in a mask such as photoresist, on a substrate to define the trenches, followed by dry or wet etching steps to transfer the pattern into the substrate. However, the mask formation steps are not limited to solely the use of photoresist. In some embodiments, a combination of photoresist with anti-reflection layers, hard mask layers, other layers, or any combinations thereof, can also be utilized to form the mask defining the pattern to be transferred into the substrate. Further, the formation of the pattern in such masks can include performing multiple wet or dry etch steps, cleaning steps, and various other related steps to provide a mask suitable for the etching of the trenches. The trenches themselves can then be formed using one or more dry or wet etch processes. The mask is then preferably removed.

It is noted that since the measurement technique described herein relies on a filling or closing of selected trenches, the formation of the trenches with correct widths is necessary. Accordingly, the trench forming process used should include any safeguard necessary to define trenches meeting a pre-defined criteria as well as the implementation of inspection steps to ensure proper trench formation and trench widths with acceptable intra- and inter-wafer variations. Such a methodology can include additional inspection steps related to the trench structures. However, the present disclosure contemplates that in some cases the existing linewidth measurement features on the wafer may serve as proxies for such measurements.

In the various embodiments, the number of trenches to be utilized can vary. As the number of trenches is increased, the number of categories of thin film thickness increases as well, as described above. Further, as the difference between the widths of the trenches is decreased, the range of thicknesses encompassed by these categories is narrowed (i.e., precision is increased). Additionally, the actual trench width values can vary linearly or non-linearly. For example, in the case where the thin film growth varies significantly (e.g., exponential changes in growth or deposition rate) based on minor changes in the thin film process conditions, a non-linear variation can be more useful for monitoring the thin film process. In contrast, where variations in process conditions result in thin film growth that varies more gradually (e.g., less than 10% or 20% variation), a linear variation in trench thickness may be adequate for monitoring the thin film process.

In one exemplary embodiment, the widths of the trenches can be selected to be between 1× and 2.5× of the target film thickness. In another exemplary embodiment, the trench line structure can include trenches with the trench widths that can range between 2× minimum target film thickness and 2× a maximum target film thickness and that includes at least one trench with trench width of 2× the target film thickness. In the various embodiments, the depths of these trenches is preferably approximately equal, where the depth is set to a pre-selected value that will ensure that at least one trench will be substantially closed post-film formation, for instance, between about 3× and 5× of the target film thickness.

These trench configurations are presented by way of example and not by way of limitation and any other trench depth and width configuration can be utilized. However, depending of the difference between the grow rates along the sidewalls and the grow rate along the bottom of the trench, the depth can be selected so that the closing or filling of the trench is due primarily to the growth on the sidewalls and not the growth from the bottom of the trench. Also, the selected depth can be chosen to reduce the impact of localized effects such as corner faceting on the accuracy of estimates of final trench width, or on the determination of whether or not the trench is closed after the processing is completed. As a result, depending on the growth or deposition rates and the target thickness, different depths can be utilized in the various embodiments.

In addition to varying trench depth and width, the inter-trench spacing between pairs of adjacent trenches can vary. For example, the inter-trench spacing can be uniform or non-uniform. Accordingly, in the various embodiments, the trench line structure can include an array of trenches of progressively increasing trench widths, progressively increasing inter-trench spacing, or both.

Figure 2:
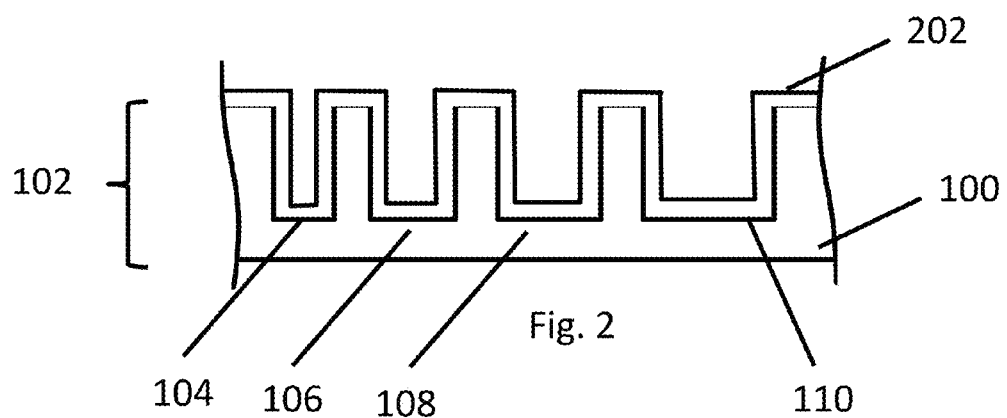
FIG. 2 illustrates a cross sectional view of the trench line structure after a thin film has been formed on the substrate.

FIG. 2 illustrates a sectional view of the trench line structure 102 of FIG. 2, after a thin film 202 has been formed on the substrate 100, where the thickness of the thin film is significantly less than one half of the width of the narrowest trench of trench line structure 102 (i.e., trench 104).

Substrate 100 can be a substrate with a silicon-comprising surface and thin film 202 can be a silicon-comprising epitaxial thin film deposited thereon. Such silicon-comprising epitaxial films can be deposited using chemical vapor deposition techniques, including plasma-enhanced chemical vapor deposition techniques, low pressure chemical vapor deposition technique, and others. However, the various embodiments are not limited in this regard and any other deposition techniques involving chemical vapor deposition, physical deposition, and the like, can be used for forming silicon comprising thin films or any other type of thin films to be monitored using trench line structures in accordance with the various embodiments.

As illustrated in FIG. 2, the trench line structure 102 is primarily designed for monitoring thin films formed concurrently on both the vertical and horizontal surfaces of the substrate. That is, thin films that will be formed on all exposed surfaces during the formation process, including the two sidewalls and the bottom surface of each trench. However, the various embodiments are not limited in this regard. Rather, the structures and methods described herein can be used with any thin film process in which the amount of thin film formed on the sidewalls is greater than, less than, or equal to the amount of thin film formed on the bottom of the trench, and the trench line structure 102 is useful in any such implementation, with the proviso that prior to the implementation, a calibration should be performed. Calibration will be described further below.

Referring back to FIG. 2, the result of the formation of thin film 202 is that the portions of thin film 202 on the two sidewalls of each trench start growing toward each other as the thin film process progresses. Thus, a new trench width of each of trenches 104-110 will be less than the original (as patterned) trench width. Specifically, the trench widths will be reduced by an amount equal to approximately two times the thickness of the thin film 202 (for a conformal thin film process).

If the thickness of film 202 increases beyond the stage illustrated in FIG. 2, or if an additional thin film having a greater thickness is formed on the substrate 100, the sidewalls of each of trenches 104-110 will continue to grow towards each other. At one point, the sidewalls for the narrowest of the trenches (e.g., trench 104) may start to substantially contact each other, resulting in one or more substantially closed trenches. As the thickness of the film 202 further increases, the number of substantially closed trenches progressively increases as the thickness of the film 202 becomes high enough to cause the sidewalls of additional trenches to start substantially contacting each other. Such a progression of trench filling or closure is illustrated with respect to FIGS. 3A-C. In particular, FIGS. 3A-3C show various states of the trenches 104-110 as the thickness of thin film 202 is increased.

Figure 3A:
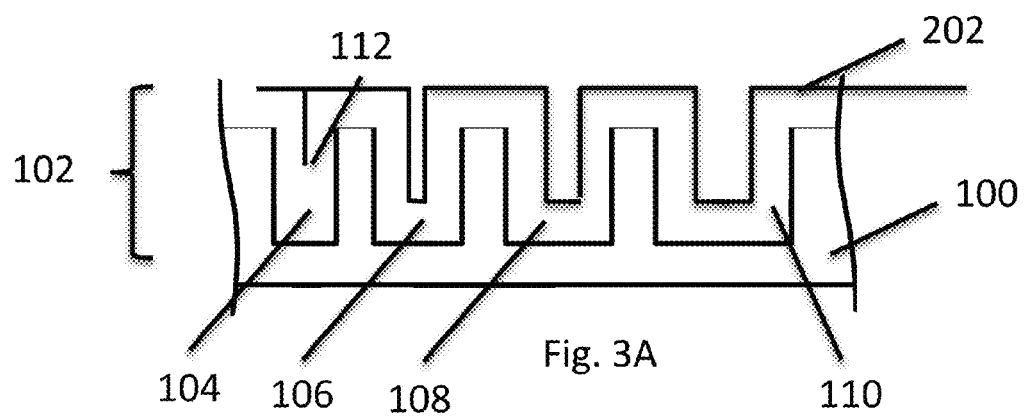
FIGS. 3A-C illustrate a cross sectional views of the trench line structure at various stages of a thin film formation process.
Figure 3B:
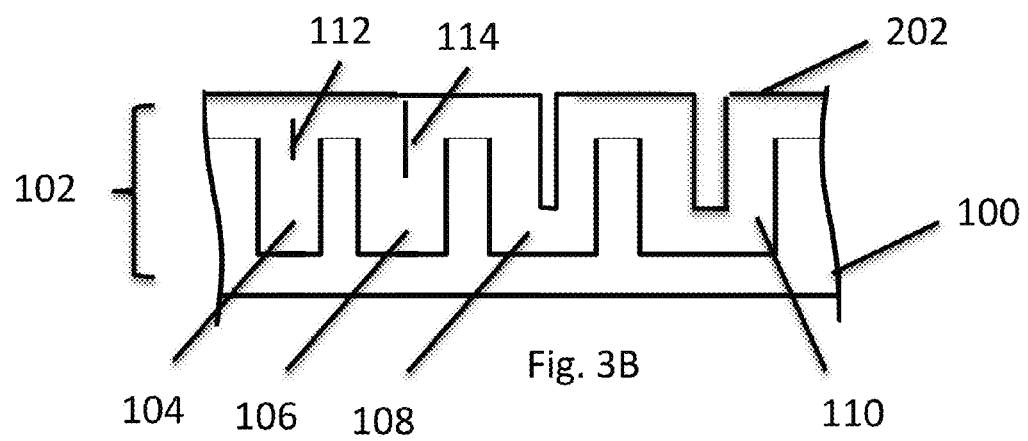
Figure 3C:
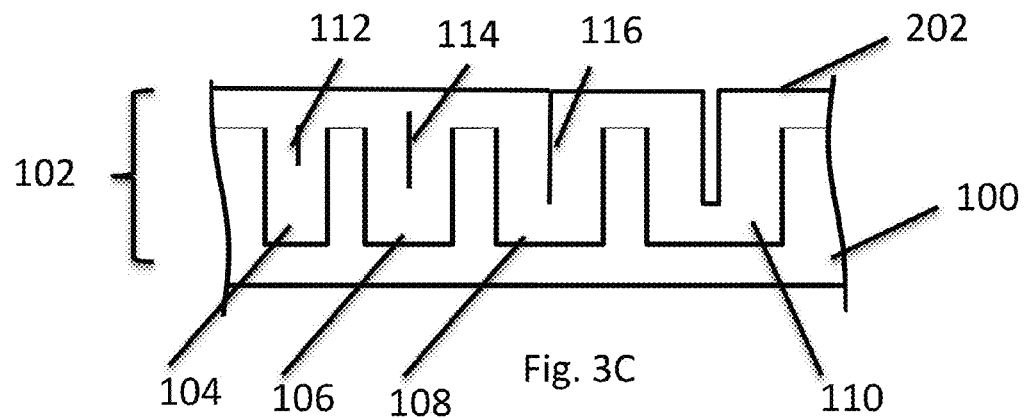

FIG. 3A illustrates a cross sectional view of the trench line structure 102 in substrate 100 following additional depositing of thin film material so that the thickness of the thin film 202 is approximately twice the thickness of trench 104 (assuming a substantially conformal process). At this point during the thin film formation process, trench 104, the narrowest trench illustrated, is substantially closed. However, as shown in FIG. 3A, the thickness of thin film 202 is not yet sufficiently high to close trenches 106, 108, and 110. However, these different trenches may be filled to different degrees. For example, as shown in FIG. 3A, trenches 106, 108, and 110 are progressively less filled.

It should be noted that any trenches having a trench width that is less than the width of trench 104 (not shown) would also be completely or substantially closed. In contrast, all trenches that are wider than trench 110 (not shown) will not be closed, substantially or otherwise, similar to trenches 106-110.

As shown in the figure, when the thin film thickness is sufficient to just start closing trench 104, i.e. the material formed on the vertical sidewalls of the trench 104 have just started coming into contact with each other, a seam is formed where this material meets in the trench 104. This seam is indicated by the vertical line 112 inside trench 104, shown in FIG. 3A. This seam is formed as a result of the material formed on facing sidewall surfaces coming into contact with each other. At this point in the process, as shown in FIG. 3A, the edge of the seam 112 may be visible at the top surface of the thin film layer during the early stages of the trench closure. A visual inspection of the structure of FIG. 3A, top-down or cross-sectional would then indicate that the current thickness of film 202 is approximately one-half the width of trench 104.

FIG. 3B illustrates a cross sectional view of the trench line structure 102 in substrate 100 following additional depositing of thin film material so that the thickness of the thin film 202 is approximately twice the thickness of trench 106 (assuming a substantially conformal process). At this point during the thin film formation process, trench 106, the narrowest trench not yet substantially filled in FIG. 3A, becomes substantially filled or closes. However, similar to FIG. 3A, the thickness of thin film 202 is not yet sufficiently high to close trenches 108 and 110, although the degree of filling of these trenches increases.

Further, any trenches having a trench width that is less than the width of trench 106 would also be completely or substantially closed. For example, trench 104 could become completely filled, as indicated by the burying of seam 112 under thin film 202. In contrast, as previously described all trenches that are wider than trench 110 (not shown) will not be closed, substantially or otherwise, similar to trenches 106-110.

As shown in the figure, when the thin film thickness is sufficient to just start closing trench 106, i.e. the material formed on the vertical sidewalls of the trench 106 have just started coming into contact with each other, a seam is formed where this material meets in the trench 106. This is indicated by the vertical line 114 inside trench 106, as shown in FIG. 3A. This seam is formed as a result of the material formed on facing sidewall surfaces coming into contact with each other. At this point in the process, as shown in FIG. 3B, the edge of the seam 114 may be visible at the top surface of the thin film layer during the early stages of the trench closure. A visual inspection of the structure of FIG. 3B, top-down or cross-sectional would then indicate to the observer that the current thickness of film 202 is approximately one-half the width of trench 106.

FIG. 3C illustrates a cross sectional view of the trench line structure 102 in substrate 100 following additional depositing of thin film material so that the thickness of the thin film 202 is approximately twice the width of trench 108 (assuming a substantially conformal process). At this point during the thin film formation process, trench 108, the narrowest trench not yet substantially filled in FIG. 3B, becomes substantially filled or closes. However, similar to FIG. 3B, the thickness of thin film 202 is not yet sufficiently high to close trench 110, although the degree of filling of this trench has increased.

Further, any trenches having a trench width that is less than the width of trench 108 would also be completely or substantially closed. For example, trench 106 could become completely filled, as indicated by the burying of seam 114 under thin film 202. In contrast, as previously described all trenches that are wider than trench 110 (not shown) will not be closed, substantially or otherwise, similar to trenches 106-110.

As shown in the figure, when the thin film thickness is sufficient to just start closing trench 108, i.e. the material formed on the vertical sidewalls of the trench 108 have just started coming into contact with each other, a seam is formed where this material meets in the trench 108. This seam is indicated by the vertical line 116 inside trench 108, as shown in FIG. 3C. This seam is formed as a result of the material on the facing sidewall surfaces coming into contact with each other. At this point in the process, as shown in FIG. 3C, the edge of the seam 116 may be visible at the top surface of the thin film layer during the early stages of the trench closure. A visual inspection of the structure of FIG. 3C, top-down or cross-sectional would then indicate to the observer that the current thickness of film 202 is approximately one-half the width of trench 108.

The progressive nature of the filling of these trenches thus enables the monitoring process of the various embodiments. That is, as noted above, as each of trenches 104, 106, and 108 become substantially filled, the thickness of film can be estimated to approximately be one half of the widths of each of trenches 104, 106, and 108, respectively (assuming a conformal process) as the process progresses. This is explained in greater detail below with respect to FIG. 3D.

Figure 3D:
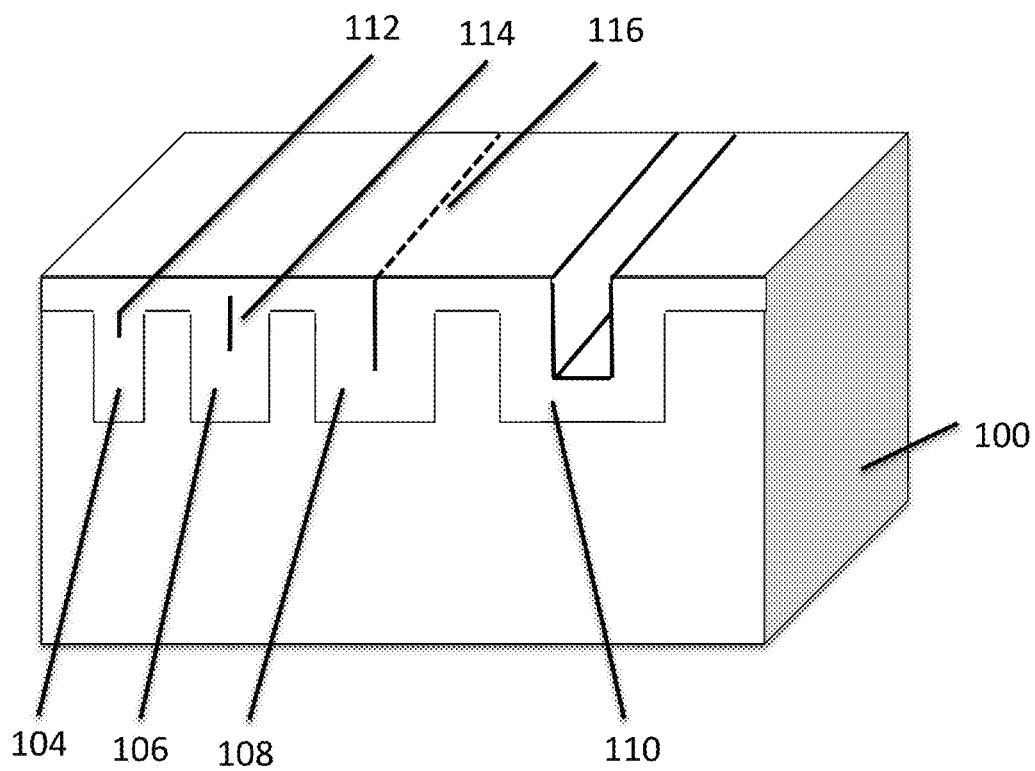
FIG. 3D illustrates a three dimensional view of the trench line structure after a thin film having a target thickness has been formed on the substrate.

FIG. 3D is a three-dimensional drawing of the trench line structure that corresponds to the cross sectional view of FIG. 3C. In this figure, the seam 116 formed in trench 108 is represented as a dotted line extending across the top surface of the thin film layer. The dotted line indicates the fact that the seam may not be continuous when the material on the sidewalls of trench 108 start coming into contact with each other. At this stage of the thin film formation process, the material on the sidewalls of the trench may be in contact for some sections of the trench but they may not be in contact for other sections of the trench.

For purposes of inspection, a trench is considered substantially closed when the seam is no longer continuous at or near the top surface of the thin film layer. That is, the trench is determined to be substantially filled when the material on two sidewalls of the trench are in contact somewhere along of the length of the seam at the top edge. In some embodiments, this measurement can be quantified. That is, a trench can be considered substantially filled or closed based on the fraction of the trench still remaining (i.e., visible). For example, as previous described, if less than 90% of the trench remains, the trench could be deemed substantially filled or closed. However, the various embodiments are not limited in this regard. Rather any degree or measure of discontinuity can be used.

In another embodiment, the trench is considered substantially closed if the depth of the seam discontinuity at the top surface of the thin film is less than a predetermined value. For example, the trench can be considered substantially closed if the depth of the discontinuity is less than 10% of the original trench depth (i.e., the trench depth before thin film deposition). The continuity of the seam, and therefore a substantially closed trench, can be determined using a visual inspection using a scanning electron microscope (SEM) or other microscope having a sufficiently high resolution.

The continuity of the seam can also be determined using a high throughput profilometer or other device that measures the surface profile with a sufficiently high throughput for in-line measurement of all or at least a portion of wafers being processed.

As noted above, the trench line structure describe above is utilized as part of a methodology for estimating thin film thickness. In particular, the various embodiments provide a methodology for estimating the thickness of a deposited thin film that forms concurrently on the various surfaces of trenches by inspection of which trench having a pre-defined width is substantially closed. In another alternative, the thickness is estimated by the change in the trench sidewall dimensions from before deposition to a comparative measurement made after the deposition process. Such a methodology relies additionally on performing a calibration process to determine a suitable trench line structure for the type of thin film being deposited. That is, some correlation of thin film thicknesses to the filling characteristics of different trenches is required. Thereafter, using this correlation, the visual inspection process described above can be utilized to provide thickness estimates. This calibration process is described below in greater detail with respect to FIG. 4.

Figure 4A:
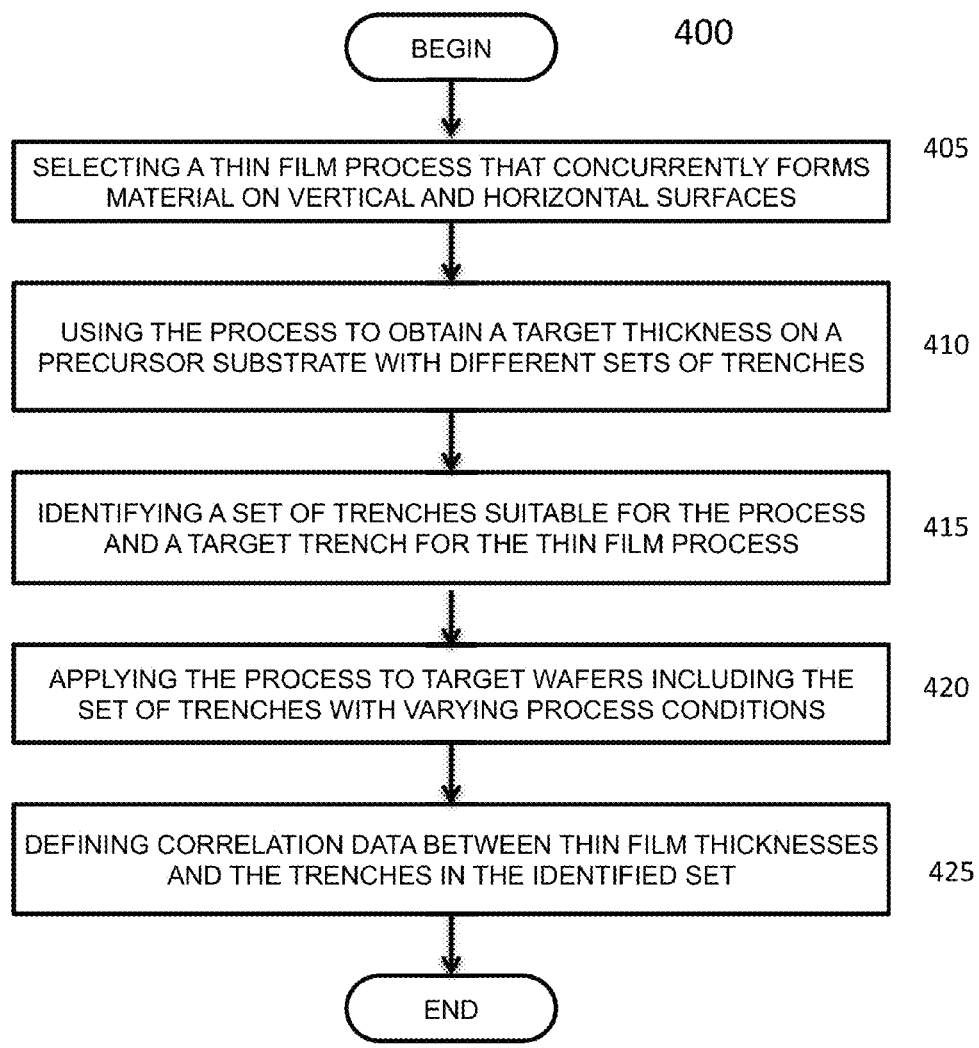
FIGS. 4A and 4B are flow diagrams illustrating a method for measuring the thickness and/or uniformity of the thin film layer.
Figure 4B:
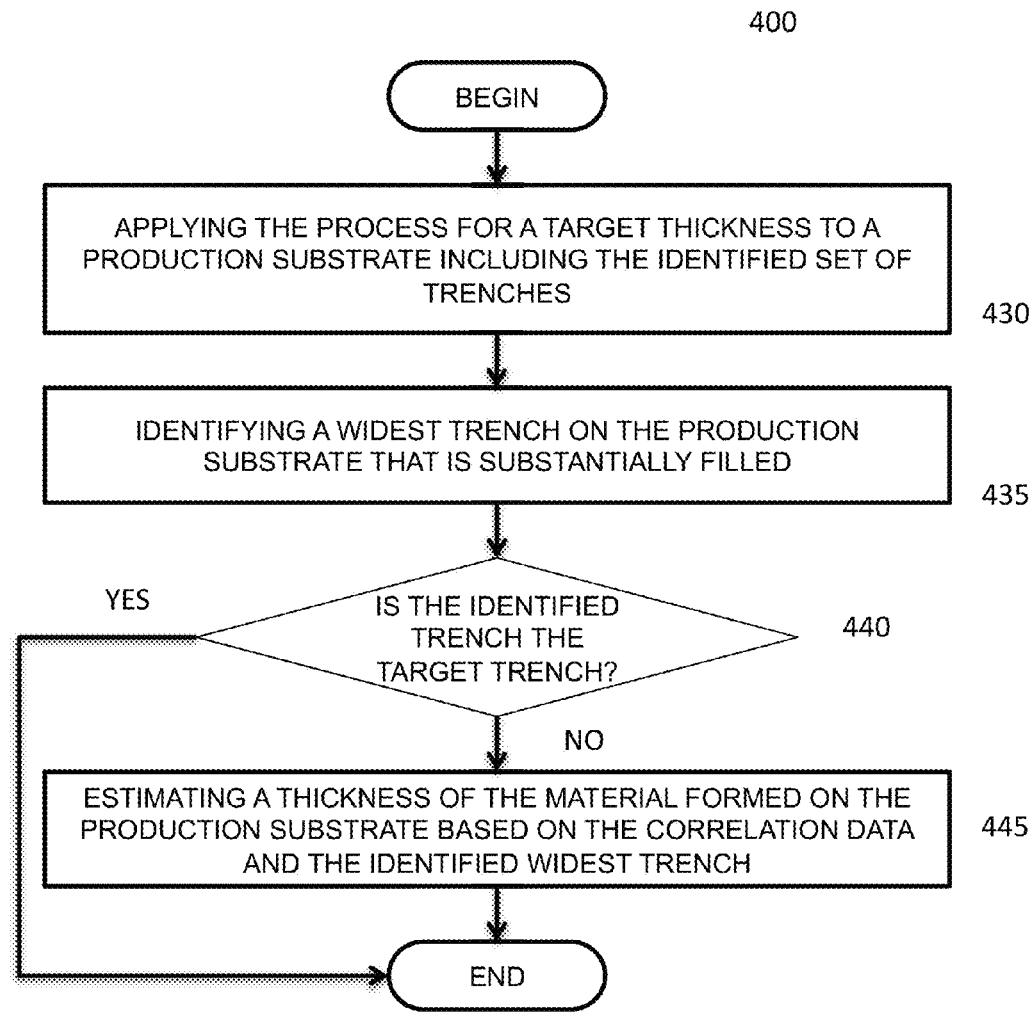

FIGS. 4A and 4B are a flow diagram illustrating steps in an exemplary method 400 for selecting, calibrating, and utilizing a trench line structure for in-line film thickness metrology.

The process 400 can be divided into two phases—a calibration phase (shown in FIG. 4A), and a thickness estimation phase (shown in FIG. 4B). The calibration phase is typically run using precursor substrate or test substrates.

The first portion of the calibration phase should include determining what type of trench line structures are desired for a given thin film process. As noted above, not only can the widths of the trenches be varied, but also their depth and spacing. In general, thin film processes can vary not only based on process conditions, but also based on the features present on the wafer. For example, the deposition characteristics (e.g., degree of conformality) in trenches of equal width and different depths can vary depending on process conditions and surface chemistries. In another example, the deposition characteristics can also vary depending on loading. That is, as the number of features (i.e., trenches) in an area increases or decreases, the deposition characteristics can also vary. As a result, it is not only necessary to identify a set of trenches in which a portion will be closed once the target thin film thickness is reached, but also identify a set of trenches in which the closing or filling of the trench is primarily due the material formed on the sidewalls meeting, not material formed on the bottom. The calibration phase of the process 400 starts at step 405 with the selection of the thin film process to be monitored, such that the selected thin film process concurrently forms material on both the horizontal and vertical surfaces of the substrate during the thin film formation process. For example, an epitaxial silicon process for a silicon substrate can be selected. At step 410, the thin film process is applied to one or more precursor substrates to form a thin film having a target thickness.

Step 410 can also include preparation of a precursor substrate that includes various sets of trenches to be tested. These sets of trenches can be formed, as described above, using various lithography and etch processes. In one embodiment, the sets of trenches can include trenches of different depths, widths, spacing, and shape, formed in the same material that will be used in a production substrate. In some embodiments, these sets of trenches can be formed in a two-dimensional array, be repeated over the surface of the precursor wafer, or both, to comprehend non-uniformities in the film deposition rate. As noted above, the different sets of trenches are utilized in order to determine a most suitable set for the thin film process being used and the target thickness for the thin film process.

Once the thin film process is implemented at step 410, a set of trenches is identified at step 415. Step 415 can include identifying a set of trenches including a trench that is substantially filled or closed primarily due to material formed on the sidewalls of trenches. This can include identifying sets of trenches having a seam extending vertically along a portion of the trench. This step can include performing destructive analyses, such as SEM imaging, to inspect the sets of trenches on the precursor wafer.

In some cases, it is possible that various sets of trenches may provide sets of trenches that include a trench that is substantially filled or closed primarily due to material formed on the sidewalls of trenches. In such cases, a set of trenches can be selected based on selection criteria. In a preferred embodiment, the criteria can specify selecting a set of trenches where the substantially closed trench is approximately in the middle of the range of the trenches in the set. In another embodiment, a set of trenches appearing to be most conformal can be selected. Alternatively, the criteria can specify the vertical length of the seam. However, the various embodiments are not limited in this regard and any other criteria are also possible.

One such alternative method to determine the film thickness would be to utilize a trench larger than 2× the estimated film thickness. In this case, the change in trench dimensions before and after the process of interest could be measured to estimate the film thickness. This technique could work for conformal films that have approximately the same growth rate regardless of substrate surface orientation (such as most ALD processes). In the case of silicon epitaxy, this technique may be less useful since the corners of the trench will tend to facet, making it difficult to estimate the side wall position until the point where the trench begins to close. In the case of an especially deep trench (such that the corner facets do not substantially affect the vertical wall growth surface), this technique may also be applicable to films such as silicon epitaxy CVD.

It is worth noting that multiple sets of trenches can be selected for certain processes. For example, if a process is known to exhibit certain non-uniformity across the wafer, different sets of trenches may be more suitable for different locations on the wafer. Accordingly, for manufacturing processes using step and repeat lithography, the correct set can be inspected for that region of the wafer. In configuration where a single mask for the entire wafer is used, the appropriate set can be used for different regions. However, the various embodiments are not limited in this regard and any number of trench sets can be utilized for a production wafer.

Step 415 also involves the identification of a target trench. That is, identifying the trench that is substantially filled when the target thickness is reached. Accordingly, this can involve evaluating a large number of precursor wafers to determine which trench should be the target trench for the thin film process.

Once the set of trenches for the process is identified at step 415, the method can proceed to step 420. At step 420, the thin film deposition process is applied to additional test substrates for a process window of interest. That is, thin films of different thicknesses are produced. Also, thin films are produced using variations in the process conditions for the target thin film Step 420 also involves preparing the test substrates. That is, this step involves applying lithography steps and etching steps, as described above, so that each test substrate includes substantially the same set(s) of trenches identified at step 415. As a result of step 420, a set of test wafers is produced that can be used to evaluate a process window to the thin film. More importantly, the test substrates can be used to evaluate the effects on process variations on the filling or closing of the trenches in the identified trench line structure.

After the test substrates are processed at step 420, correlation data can be gathered at step 425 with respect to the fill characteristics of the array of trenches relative to the film deposition process that is used and the expected thickness of the resulting film. In particular, for different thicknesses of material due to various process conditions, the trenches that are being substantially filled or closed can be identified for later use in identifying a thickness of the thin film on a production wafer.

It is worth noting that measurement of a thin film of a first material on a substrate consisting of a second material can be non-trivial in some cases (e.g., very thin silicon on silicon substrates). Accordingly in these embodiments, other techniques can be utilized at steps 420 and 425 to obtain thickness information. For example, measurement wafers with features that can be measured via ellipsometry or profilometry, as previously described, can be run concurrently with the test substrates or using a same process as a test substrate to obtain thickness data for the correlation. Any other methods can also be used in the various embodiments. In particular, destructive and time-consuming methods can be used during this calibration. After the completion of the calibration phase, the collected data can be used during an estimation or production phase, as described below with respect to FIG. 4B.

As shown in FIG. 4B, the estimation phase starts at step 430 with the application of the thin film process to production substrates, where each production substrate includes the trench line structures identified in FIG. 4A for the thin film process. At step 435, the widest substantially closed trench on the trench line structure of the production substrate is identified using techniques such as optical inspection or surface profile measurement. Such processes can be performed manually or automatically. At step 440, a determination can be made as to whether the target thickness for the thin film process has been achieved. In particular, the identified trench from step 435 is compared to the target trench identified during the calibration phase. If there is a match, then it is assumed that the target thin film thickness has been achieved. If there is no match, then it is assumed that the target thin film thickness was not achieved. As a result, additional characterization of the wafer may be needed. However, as noted above, during the calibration phase the variance in the process may have been characterized. In particular, correlation data may exist that correlates the closing or filling of particular trenches with particular thin film thicknesses. Thus, at step 440, the thin film thickness can estimated based on the correlation data obtained during the calibration phase.

Ideally, the thin film process will always result in the same trench fill characteristics. That is, for a target thickness of a film, the substantially filled trench in the trench line structure should be the same trench within a trench array for each wafer, every time. However, thin film processes can drift over time due to several factors. Also, errors can occur in the implementation of the deposition process, for instance, the wrong time or wrong process conditions may be selected for a given process run. Accordingly, the metrology embodiments described not only allows the drift or error to be detected, but also allow some quantification of the drift or error. That is, if the process results in a deposited or grown film that is too thick, a wider trench will also be substantially filled. The target trench might be completely filled in such a case. Conversely, if the process results in a deposited or grown film that is too thin, a narrower trench will be substantially filled and the target trench would still define a continuous trench. Accordingly, based on widest trench that is substantially filled and the correlation data associated with such a trench, the error in thickness can be determined and appropriate action can be taken in-line to correct other wafers.

More importantly, this inspection process provides a method for reducing scrap wafers. That is, at least in the case of epitaxial silicon and other epitaxial thin films, the thicknesses of these thin films are typically characterized at or near the end of processing of wafers in a semiconductor manufacturing line. Thus, if drift or error has occurred early on, not only is the inspected wafer itself subject to scrap, but in addition, a so will a portion of other wafers concurrently processed and wafers still undergoing processing. Accordingly, a substantial investment of time and resources may have occurred and may be lost. However, since the various embodiments allow this drift or error to be determined soon after the thin film process is performed, the drift or error can be corrected at a much earlier point in the semiconductor manufacturing process. Thus, reducing the amount of time and resources invested in such wafers. Moreover, the number of wafers exposed to such drift or error is also reduced. Accordingly, the quantity of wafers subject to scrap can be reduced significantly.

Although the discussion above regarding FIGS. 4A and 4B has focused primarily on inspection of a single trench line structure to determine whether or not a target thin film thickness has been achieved, the various embodiments are not limited in this regard. Rather, the methodology above can also be utilized to characterize the degree of uniformity of the thin film across the wafer. That is, as previously described, target trenches can be selected during the calibration phase for different parts of the wafer. Further, the variation in thin film thickness for these different parts of the wafer can also be determined during the calibration phase. Accordingly, using such target trenches and such calibration data, an inspection of the trench line structures can not only be used to determine whether target thin film thickness values were achieved across the wafer, but can also be used to determine whether an error or drift in the process has occurred.

The various embodiments described above have primarily focused on identifying trenches that are substantially filled or closed. However, in some embodiments, the inspection can focus on remaining trenches. That is, a thin film process can be monitored based on the remaining, incompletely filled trenches instead of the substantially filled trenches. The term "incompletely filled", as used with respect to a trench, refers to a trench in which after material is formed on the sidewalls and bottom of the trench, there is provided a resulting trench having a gap remaining between opposing trench sidewalls (little or no bridging between the sidewalls). Alternatively stated, this is a trench in which the thin film materials deposited or grown on the facing sidewalls have not yet come into contact with each other. Such a configuration provides the advantage that in some cases it may be easier to identify these incompletely filled trenches than it is to identify substantially filled trenches. Further, in some cases, it is possible that no trenches are substantially filled. That is, the thin film process may result in trenches that are completely filled and trenches that are not completely filled. In such cases, calibration can be carried out in a substantially similar fashion as described above. That is, where the basis for selecting a set of trenches and determining thicknesses of the thin film is based on those trenches that are incompletely filled.

Figure 5A:
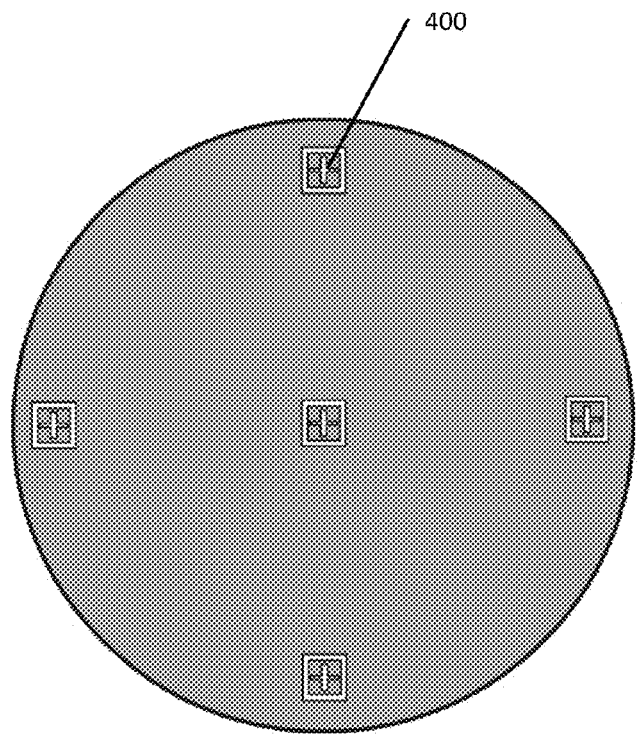
FIG. 5A illustrates a wafer with zero layer alignment marks that include the trench line structures.
Figure 5B:
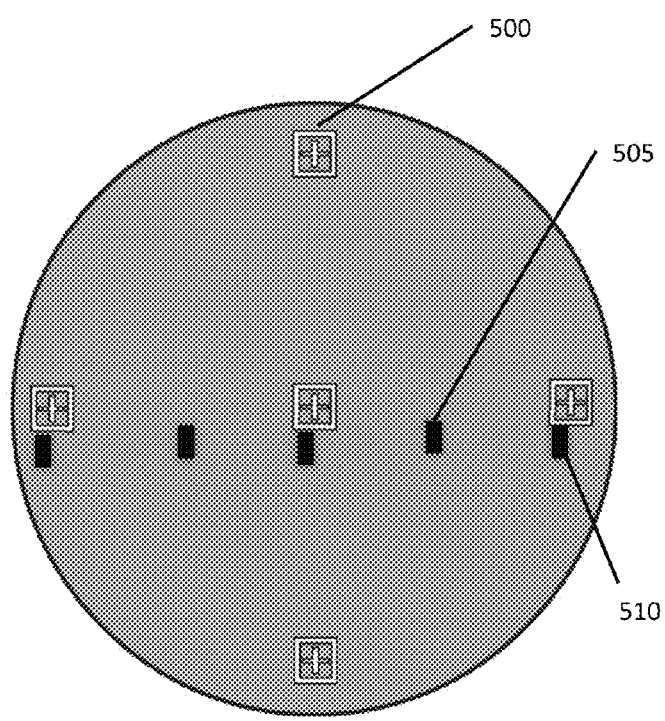
FIG. 5B illustrates a wafer with separate zero layer alignment marks and trench line structures.
Figure 5C:
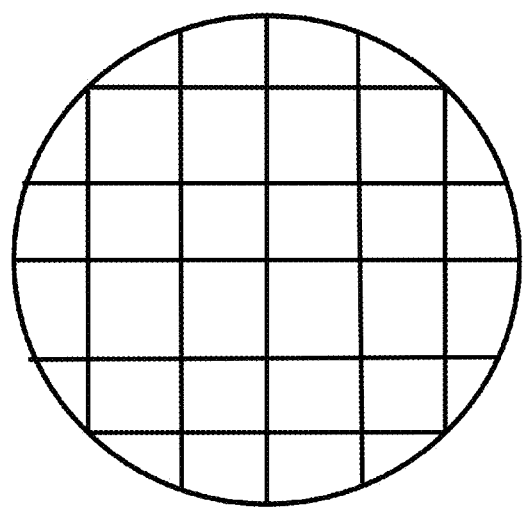
FIG. 5C illustrates a wafer with trench line structures located in the scribe lines.

As noted above, the trench line structures described above can be fabricated at one or more locations on the wafer. Further, the trench line structures can be fabricated as part of the existing alignment mark fabrication, or can be fabricated separately. For example, FIG. 5A shows a silicon wafer with multiple alignment marks 500 that include one or more trench line structures, in accordance with one embodiment. In general, an initial alignment mask is always required by other steps in a fabrication process, as all other levels are aligned based on these initial marks. Therefore, by incorporating the trench line structure into the initial alignment mark mask, no additional masks or steps would be needed to implement the trench line structures onto each product wafer. FIG. 5B illustrates a silicon wafer with multiple alignment marks 500 and multiple trench line structures 505, where the trench line structures are not part of the alignment marks, in accordance with an alternative embodiment. As shown in the figure, the trench line structures can be located near the alignment marks and/or they can be located at positions that do not have an alignment mark. FIG. 5C illustrates an embodiment where the trench line structures are located in the scribe lines (shown as the vertical and horizontal lines). In other embodiments, the metrology structures can be located within individual die fabricated on the wafer.

As noted above, the trench line structures and the related methods and techniques described above can be used to monitor a process that forms a layer of semiconducting material on a semiconductor substrate. Such a process can include a process for forming a substantially undoped epitaxial silicon layer, or an in-situ doped epitaxial silicon layer such as those formed during the fabrication of the DDC transistor.

Such a non-destructive method allowing for quick, accurate and precise measurement of the epitaxial layer thickness can be advantageous for certain types of transistors that are sensitive to epitaxial layer thickness. These transistors include but are not limited to transistors with undoped, slightly doped, or heavily doped channels defined in thin epitaxially grown silicon. One particular transistor having an epitaxial channel that supports a deeply depleted channel (DDC) transistor is described in U.S. patent application Ser. No. 12/708,497 titled "Electronic Devices and Systems, and Methods for Making and Using the Same", U.S. patent application Ser. No. 12/971,884 titled "Low Power Semiconductor Transistor Structure and Method of Fabrication Thereof", U.S. patent application Ser. No. 12/971,955 titled "Transistor with Threshold Voltage Set Notch and Method of Fabrication Thereof", and U.S. patent application Ser. No. 12/960,266 titled "Semiconductor Structure and Method of Fabrication Thereof with Mixed Metal Types", the disclosures of which are hereby incorporated by reference in their entirety.

By being able to monitor the thickness of deposited material directly on product wafers, direct tuning can be performed to minimize thickness variation across the wafer, and from wafer-to-wafer. Also, statistical process control (SPC) or automatic process control (APC) monitoring can be performed on the product wafers to control the process more tightly than if no direct monitoring of deposited thickness was performed.

In batch reactors, or systems in which several wafers have epitaxial layers grown on their surfaces simultaneously, it can be important to monitor the consistency of the epitaxial layer in extreme positions within the reactor chamber. Even in single wafer systems, the uniformity of the epitaxial silicon layer thickness across the wafer can be important, as subsequent processing steps can require a flat, uniform layer thickness to provide consistent device yield for devices located across the entire wafer surface. This can become even more important as wafer sizes increase, as a bigger wafer size can put higher demands of the epitaxial silicon layer fabrication process and the resulting film thickness uniformity to ensure reasonable yields. The structures and methods described herein are also advantageously used in such fabrication processes because they permit a quick and accurate measurement/inspection of one or more sites on the product wafers to determine if the epitaxial silicon layer thickness meets predetermined target thickness specifications.

The method and system herein provides for a flexible implementation. Although described using certain specific examples, it will be apparent to those skilled in the art that the examples are illustrative, and that many variations exist. In general, the present disclosure is directed to various methods for determining, tracking and/or controlling epitaxial layer processing. More particularly one embodiment is directed to correlating various characteristics or properties of wafers with various metrology data obtained during the course of manufacturing integrated circuit devices, and performing various control functions based upon such correlations. As will be readily apparent to those skilled in the art upon a complete reading of the present application, the present method is applicable to a variety of technologies, including planar CMOS, SOI, finFETs etc., and it is readily applicable to a variety of devices, including, but not limited to, logic devices, memory devices, etc. While particularly useful for blanket epitaxial silicon depositions, including very thin intrinsic silicon deposited over lightly doped substrates, variations of the techniques described could be used for heavily doped silicon, silicon alloys such as SiGe and SiGeC layers, metal layers, polysilicon or amorphous silicon deposition, and selective silicon deposition. Wafers comprised of any of a variety of semiconducting materials, e.g., silicon, gallium arsenide, etc. can be used. Moreover, such wafers, if appropriate, may be doped with a variety of dopant materials, e.g., arsenic, phosphorous, boron, etc. Lastly, as used herein, the term wafer should be understood to include the bare wafer itself, i.e., bare silicon, or a wafer having an epitaxial silicon layer (epi layer) formed above the bare silicon.

Although the present disclosure has been described in detail with reference to particular embodiments, it should be understood that various other changes, substitutions, and alterations may be made hereto without departing from the spirit and scope of the appended claims. Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

What is claimed is:

1. A method for monitoring a process that concurrently forms at least one material on vertical and horizontal surfaces on the surface of a substrate, the method comprising:
   providing a first substrate having a first surface, the first surface comprising a plurality of trenches of substantially a same depth and having substantially different widths;
   applying the process to the first substrate using process parameters selected to provide a target thickness for the at least one material;
   identifying a widest one of the plurality of trenches substantially filled with the at least one material to yield an identified trench; and
   determining whether the process provided the target thickness based on the identified trench and pre-defined correlation data specifying a target trench corresponding to the target thickness.

2. The method of claim 1, further comprising:
   estimating a thickness of the at least one material based on the identified trench and on pre-defined correlation data, the pre-defined correlation data specifying a correlation between a substantial filing of the plurality of trenches and thicknesses for the at least one material for the process.

3. The method of claim 1, wherein the providing comprises forming the plurality of trenches on the first surface, the forming comprising selecting the plurality of widths to be between about 1× and 2.5× of the target thickness.

4. The method of claim 3, the forming further comprising selecting the depth to be between about 2× and 5× of the target thickness.

5. The method of claim 1, wherein the first substrate comprises a plurality of scribe regions, and wherein the providing comprises forming the plurality of trenches on the first surface in the plurality of scribe regions.

6. The method of claim 1, wherein the first surface comprises a semiconductor surface.

7. The method of claim 1, wherein the providing comprises forming the plurality of trenches on the first surface during an alignment mask process.

8. The method of claim 1, wherein the providing comprises selecting dimensions for the plurality of trenches, the selecting comprising:
   providing at least one precursor substrate, the at least one precursor substrate comprising one or more sets of trenches, each of the sets of trenches comprising a series of trenches having substantially different widths, and each of the set of trenches associated with a substantially different depth;
   applying the process to the at least precursor substrate using process parameters selected to provide a target thickness for the at least one material;
   identifying one set from the sets of trenches comprising a first trench that is substantially filled with the at least one material, at least one second trench that is completely filled with the at least one material, and at least one third trench still defining a trench; and
   selecting the one set to define the plurality of trenches for the first substrate, wherein the first trench is the target trench.

9. The method of claim 8, further comprising generating the pre-defined correlation data, the generating comprising:
   providing a plurality of test substrates each comprising the plurality of trenches;
   applying the process to the plurality of test substrates using process parameters selected to provide different thicknesses for the at least one material on different ones of the plurality of test substrates;
   obtaining a measure of the thicknesses of the at least one material for each of the plurality of test substrates; and
   identifying a widest one of the plurality of trenches substantially filled with the at least one material on each of the plurality of substrates to yield identified trenches and correlating to the measured thicknesses and the identified trenches to generate the pre-defined correlation data.

10. A method for monitoring a process for forming that concurrently forms a semiconductor film on vertical and horizontal surfaces on the surface of a substrate comprising the semiconductor material, the method comprising:
    forming a trench line structure on the surface of the substrate, the trench line structure comprising a plurality of trenches of substantially a same depth and having substantially different widths;
    applying the process to the substrate using process parameters selected to provide a target thickness for the semiconductor material;
    identifying a widest trench in the trench line structure substantially filled with the at least one material to yield an identified trench; and
    determining whether the process provided the target thickness based on the identified trench and pre-defined correlation data specifying a target trench corresponding to the target thickness.

11. The method of claim 10, further comprising:
    estimating a thickness of the semiconductor material based on the identified trench and on pre-defined correlation data, the pre-defined correlation data specifying a correlation between a substantial filing of the plurality of trenches and thicknesses for the semiconductor material for the process.

12. The method of claim 10, wherein the semiconductor material comprises silicon.

13. The method of claim 10, wherein the providing comprises forming the plurality of trenches on the surface of the substrate during an alignment mask process.

14. The method of claim 10, wherein the providing comprises selecting dimensions for the plurality of trenches, the selecting comprising:
    providing at least one precursor substrate having a surface comprising the semiconductor material, the at least one precursor substrate comprising one or more sets of trenches, each of the sets of trenches comprising a series of trenches having substantially different widths, and each of the set of trenches associated with a substantially different depth;

applying the process to the at least precursor substrate using process parameters selected to provide a target thickness for the semiconductor material;

identifying one set from the sets of trenches comprising a first trench that is substantially filled with the semiconductor material, at least one second trench that is completely filled with the semiconductor material, and at least one third trench still defining a trench; and selecting the one set to define the plurality of trenches for the first substrate, wherein the first trench is the target trench.

15. The method of claim 14, further comprising generating the pre-defined correlation data, the generating comprising:

providing a plurality of test substrates each comprising the plurality of trenches formed on a surface of the test substrate comprising the semiconductor material;

applying the process to the plurality of test substrates using process parameters selected to provide different thicknesses for the semiconductor material on different ones of the plurality of test substrates;

obtaining a measure of the thicknesses of the semiconductor material for each of the plurality of test substrates; and identifying a widest one of the plurality of trenches substantially filled with the semiconductor material on each of the plurality of substrates to yield identified trenches and correlating to the measured thicknesses and the identified trenches to generate the pre-defined correlation data.

16. A method for monitoring a process for forming that concurrently forms at least one material on vertical and horizontal surfaces on the surface of a substrate, the method comprising:

providing a first substrate having a first surface, the first surface comprising a plurality of trenches of substantially a same depth and having substantially different widths;

applying the process to the first substrate using process parameters selected to provide a target thickness for the at least one material;

identifying a narrowest one of the plurality of trenches that is incompletely filled yield an identified trench; and determining whether the process provided the target thickness based on the identified trench and pre-defined correlation data specifying a target trench corresponding to the target thickness.

17. The method of claim 16, further comprising:

estimating a thickness of the at least one material based on the identified trench and on pre-defined correlation data, the pre-defined correlation data specifying a correlation between ones of the plurality of trenches defining trenches incompletely filled after the process and thicknesses for the at least one material for the process.

18. The method of claim 16, wherein the providing comprises selecting dimensions for the plurality of trenches, the selecting comprising:

providing at least one precursor substrate, the at least one precursor substrate comprising one or more sets of trenches, each of the sets of trenches comprising a series of trenches having substantially different widths, and each of the set of trenches associated with a substantially different depth;

applying the process to the at least precursor substrate using process parameters selected to provide a target thickness for the at least one material;

identifying one set from the sets of trenches comprising a plurality of first trenches filled with the at least one material and a plurality of second trenches defining trenches that are incompletely filled; and selecting the one set to define the plurality of trenches for the first substrate, wherein a narrowest one of the second trenches is the target trench.

19. The method of claim 18, further comprising generating the pre-defined correlation data, the generating comprising:

providing a plurality of test substrates each comprising the plurality of trenches;

applying the process to the plurality of test substrates using process parameters selected to provide different thicknesses for the at least one material on different ones of the plurality of test substrates;

obtaining a measure of the thicknesses of the at least one material for each of the plurality of test substrates; and identifying a narrowest one of the plurality of trenches still defining an incompletely filled trench on each of the plurality of substrates to yield identified trenches and correlating to the measured thicknesses and the identified trenches to generate the pre-defined correlation data.

* * * * *